US012664636B2

(12) United States Patent
Kim

(10) Patent No.: US 12,664,636 B2
(45) Date of Patent: Jun. 23, 2026

(54) SYSTEM FOR EXECUTING SAFETY INSPECTION AND MAINTENANCE OF OUTDOOR BILLBOARD BY USING DRONE

(71) Applicant: Byung Chul Kim, Paju-si (KR)

(72) Inventor: Byung Chul Kim, Paju-si (KR)

( * ) Notice: Subject to any disclaimer, the term of this patent is extended or adjusted under 35 U.S.C. 154(b) by 255 days.

(21) Appl. No.: 18/675,248

(22) Filed: May 28, 2024

(65) Prior Publication Data

US 2025/0371689 A1 Dec. 4, 2025

(51) Int. Cl.
| | |
|---|---|
| *G06T 7/00* | (2017.01) |
| *G01R 31/40* | (2020.01) |
| *G05D 1/661* | (2024.01) |
| *G05D 1/689* | (2024.01) |
| *G06T 7/20* | (2017.01) |
| *G06V 20/10* | (2022.01) |
| *G06V 20/17* | (2022.01) |
| *G06V 20/62* | (2022.01) |
| *G06V 30/12* | (2022.01) |
| *G05D 105/80* | (2024.01) |
| *G05D 107/00* | (2024.01) |
| *G05D 109/25* | (2024.01) |

(52) U.S. Cl.
CPC ............ *G06T 7/0002* (2013.01); *G01R 31/40* (2013.01); *G05D 1/661* (2024.01); *G05D 1/689* (2024.01); *G06T 7/20* (2013.01); *G06V 20/17* (2022.01); *G06V 20/176* (2022.01); *G06V 20/63* (2022.01); *G06V 30/133* (2022.01); *G05D 2105/89* (2024.01); *G05D 2107/00* (2024.01); *G05D 2109/254* (2024.01); *G06T 2207/10032* (2013.01); *G06T*

2207/10048 (2013.01); *G06T 2207/20081* (2013.01); *G06T 2207/30242* (2013.01)

(58) Field of Classification Search
None
See application file for complete search history.

(56) References Cited

U.S. PATENT DOCUMENTS

| | | | | |
|---|---|---|---|---|
| 9,505,494 | B1 * | 11/2016 | Marlow | G05D 1/0011 |
| 10,417,755 | B1 * | 9/2019 | Wingo | H04W 24/02 |

(Continued)

*Primary Examiner* — Henok Shiferaw
(74) *Attorney, Agent, or Firm* — LEX IP MEISTER, PLLC

(57) ABSTRACT

The present invention discloses a system for executing safety inspection and maintenance of an outdoor billboard by using a drone, which includes a drone (110) including an optical camera (111) and an infrared camera (112), and flying over a sky around a building in which the outdoor billboard is installed, and taking images of the outdoor billboard and a connection bracket (20) with the building; a monitoring unit (120) monitoring an image taken by the drone (110), and analyzing the image to identify deformation of an exterior (10) of the outdoor billboard and whether the connection bracket (20) is defective; a flight control unit (130) controlling a flight of the drone (110); and an inspection vehicle (140) driving through an inspection area of the outdoor billboard, and having a docking station (141) for landing and charging the drone (110) on a roof, in which safety inspection of an outdoor billboard is sequentially performed by using a drone while moving in an inspection vehicle, and maintenance is performed with one stop according to a safety inspection result by using a maintenance tool provided in the inspection vehicle.

5 Claims, 4 Drawing Sheets

(56)　　　　　　References Cited

U.S. PATENT DOCUMENTS

| | | | | |
|---|---|---|---|---|
| 10,853,942 B1 * | 12/2020 | Boyd | .......................... | G06T 7/80 |
| 2023/0091883 A1 * | 3/2023 | Kim | ....................... | B64D 47/08 |
| | | | | 244/189 |
| 2023/0286556 A1 * | 9/2023 | Qian | ...................... | G05D 1/106 |

* cited by examiner

[FIG. 1]
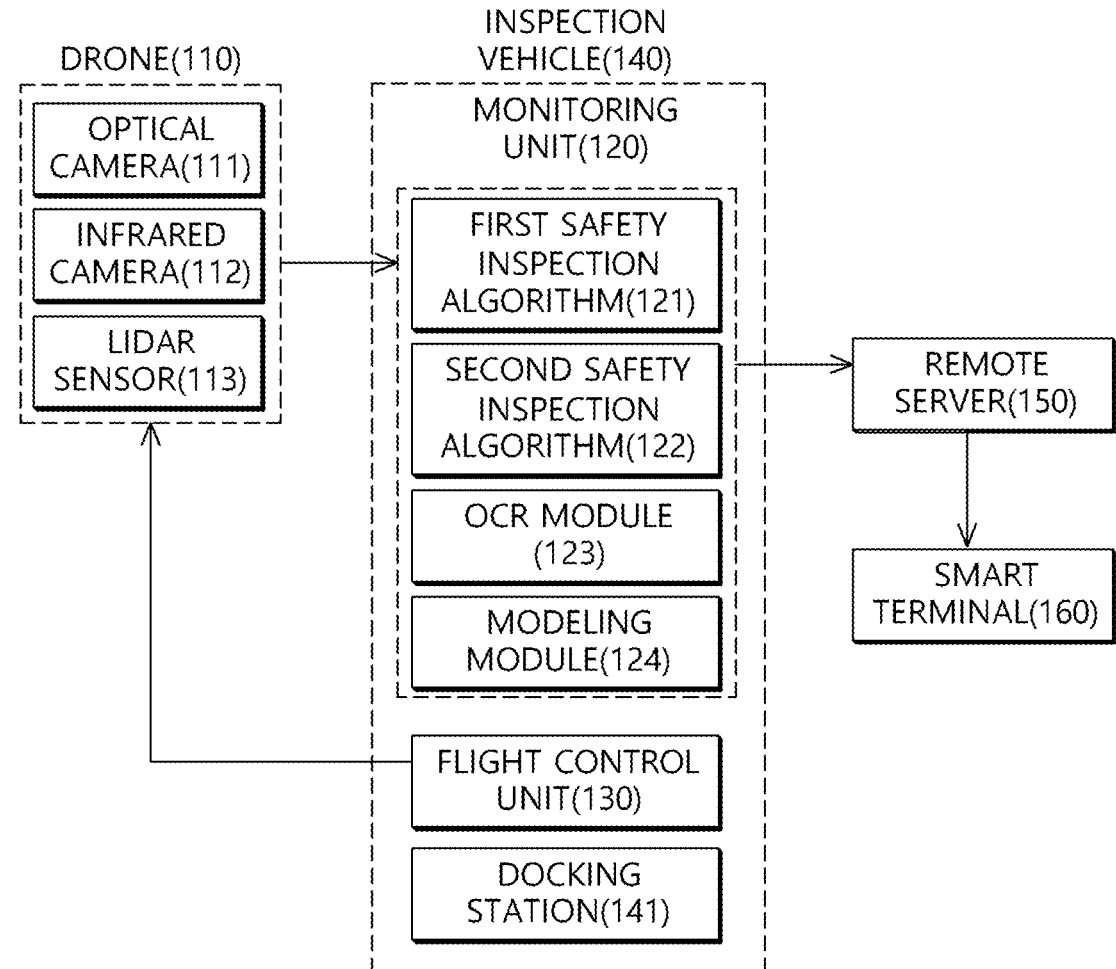

[FIG. 2]
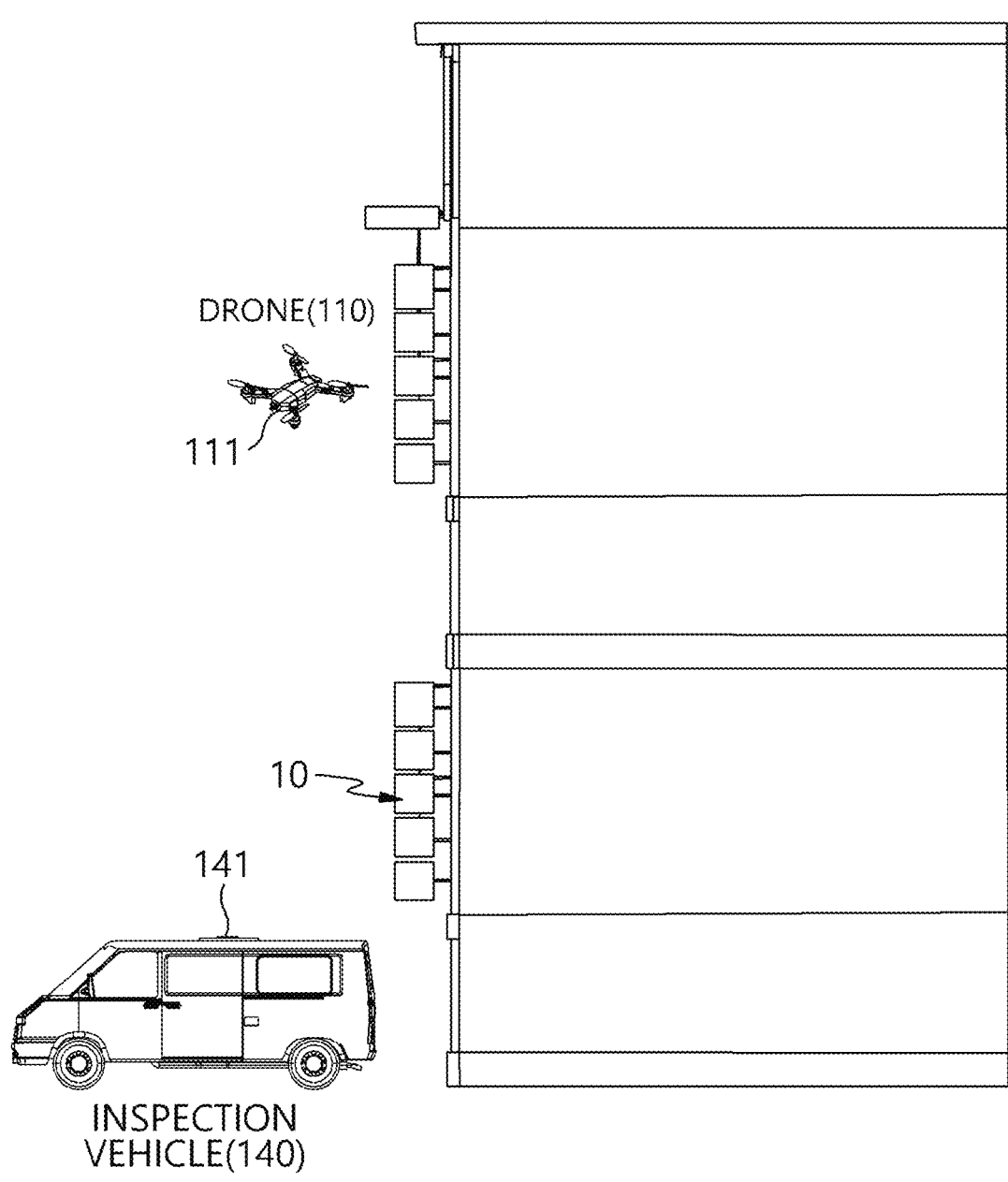
DRONE(110)
111
10
141
INSPECTION
VEHICLE(140)

[FIG. 3]
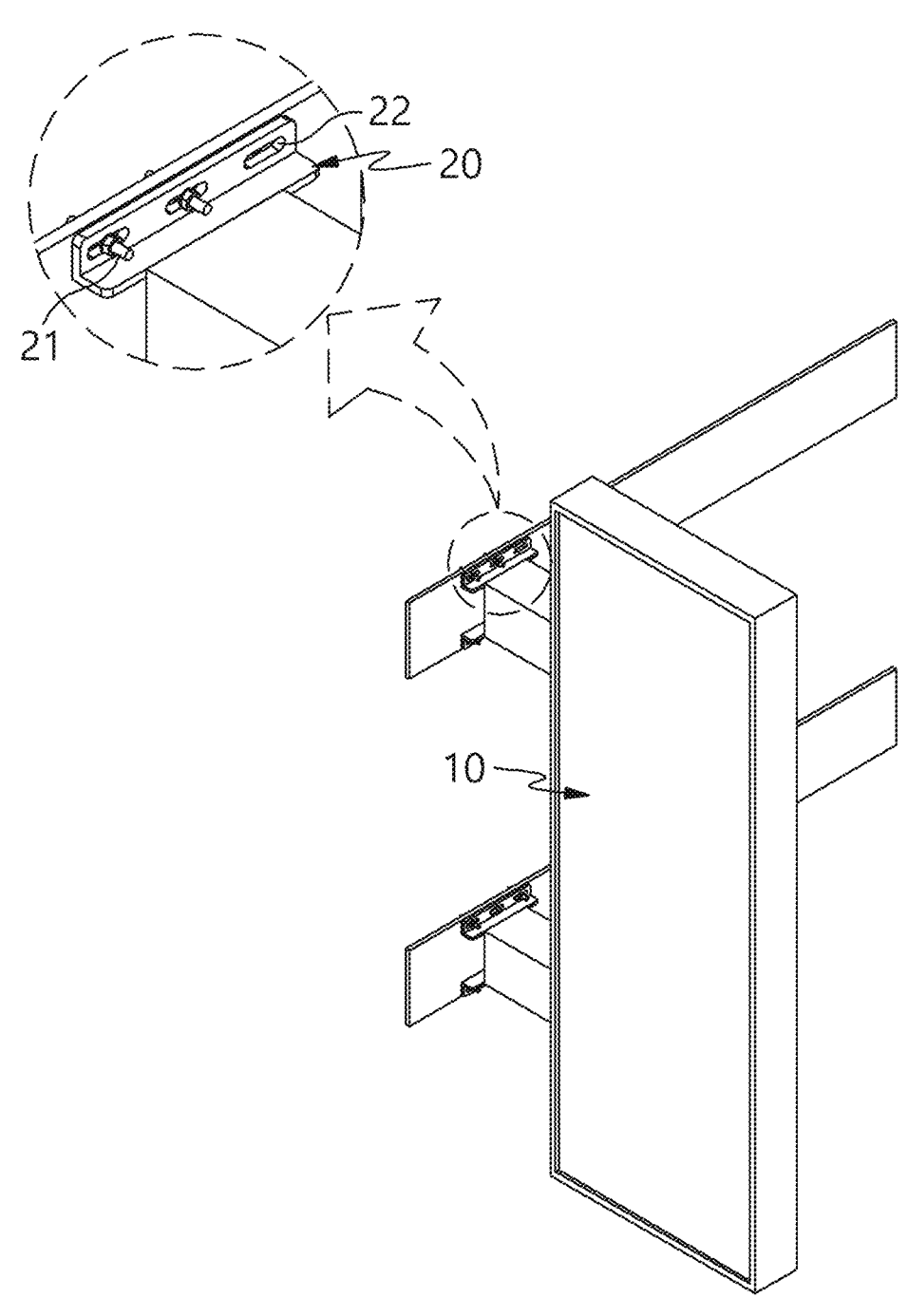

[FIG. 4]
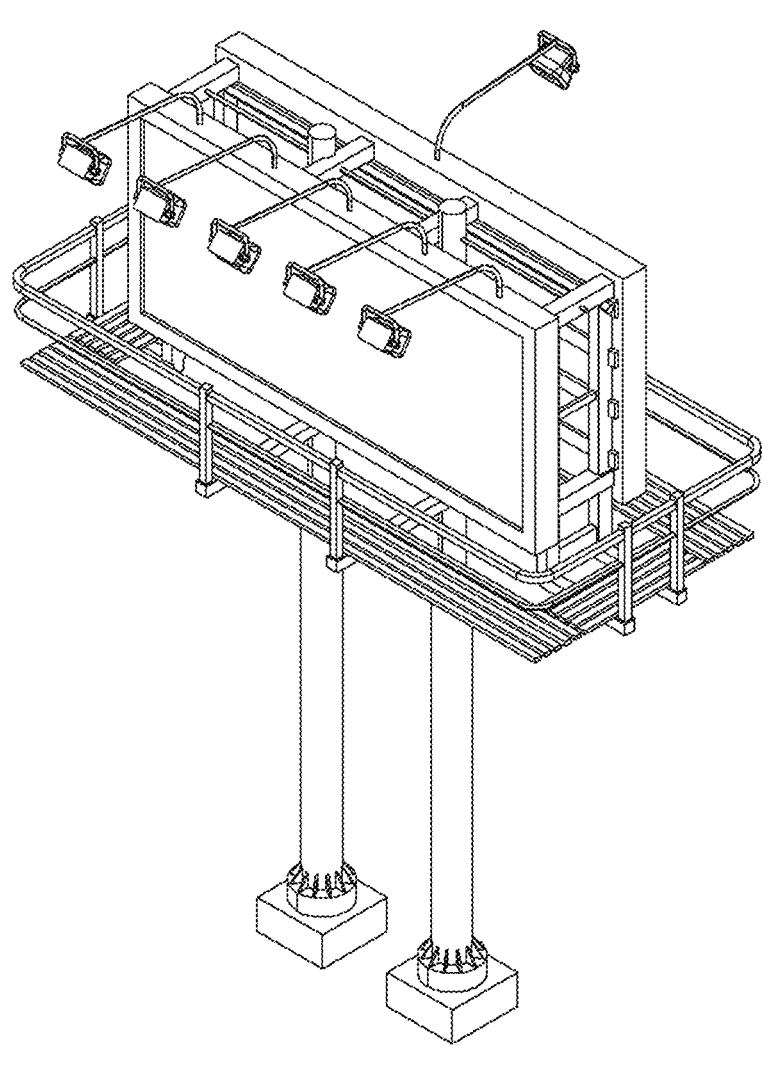

SYSTEM FOR EXECUTING SAFETY INSPECTION AND MAINTENANCE OF OUTDOOR BILLBOARD BY USING DRONE

BACKGROUND OF THE INVENTION

1. Field of the Invention

The present invention relates to a system for executing safety inspection and maintenance of an outdoor billboard by using a drone, which may sequentially perform safety inspection of an outdoor billboard by using a drone while moving in an inspection vehicle, and rapidly perform maintenance with one stop according to a safety inspection result by using a maintenance tool provided in the inspection vehicle.

2. Description of the Related Art

As is known, a plurality of outdoor billboards is attached for advertising on the outer walls of a large shopping mall building. In particular, as the number of self-employed workers increases, the number of outdoor billboards also increases. These outdoor billboards are exposed to a sidewalk, which is passed by unspecified majority, and safety accidents may occur due to the fall of outdoor billboards due to poor management, typhoons, and strong winds, which requires regular safety inspections.

On the other hand, for safety inspections of large structures, a scheme of inspecting the exterior of the structure through the naked eye of the safety inspection expert is widely used.

However, there is a limit that the outdoor billboards, which are difficult for safety inspection experts to approach or to identify by the naked eye, are forced to be placed in the blind spot of safety inspection.

As a result, a technology is required in which drones are required to perform safety inspections of multiple outdoor advertisements installed in high floors sequentially.

SUMMARY OF THE INVENTION

An object of the present invention is to provide a system for executing safety inspection and maintenance of an outdoor billboard by using a drone, which may sequentially perform safety inspection of an outdoor billboard by using a drone while moving in an inspection vehicle, and rapidly perform maintenance with one stop according to a safety inspection result by using a maintenance tool provided in the inspection vehicle.

In order to achieve the object, the present invention provides a system for executing safety inspection and maintenance of an outdoor billboard by using a drone, which includes: a drone including an optical camera and an infrared camera, and flying over a sky around a building in which the outdoor billboard is installed, and taking images of the outdoor billboard and a connection bracket with the building; a monitoring unit monitoring an image taken by the drone, and analyzing the image to identifying deformation of an exterior of the outdoor billboard and whether the connection bracket is defective; a flight control unit controlling a flight of the drone; and an inspection vehicle driving an inspection area of the outdoor billboard, and having a docking station for landing and charging the drone on a roof.

Here, the monitoring unit may include a first safety inspection algorithm based on artificial intelligence which is previously learned by using, as a learning dataset, optical images of the outdoor billboard, and the connection bracket which are previously collected and stored, and the deformation of the exterior and whether the connection bracket is defective, and analyzes the optical image transmitted from the optical camera of the drone through the first safety inspection algorithm to predict the deformation of the exterior and whether the connection bracket is defective.

Further, the first safety inspection algorithm may identify whether the number of bolts fastened to the connection bracket from the optical image matches the number of bolt holes of the connection bracket from the optical image to predict whether the connection bracket is defective.

In addition, the first safety inspection algorithm may analyze optical imagesbracketbracket of the outdoor billboard and the connection bracket to identify a birdhouse or foreign substances attached to the outdoor billboard and the connection bracket.

Further, the monitoring unit may include a second safety inspection algorithm based on the artificial intelligence which is previously learned by using, as a learning dataset, a thermal image of the outdoor billboard which is previously collected and stored, and whether a power supply unit driving a lighting of the outdoor billboard is defective, and may predict whether the power supply unit is defective by analyzing the thermal image transmitted from the drone through the second safety inspection algorithm.

In addition, the flight control unit may set a flight path to the docking station, and land the drone on the locking station, and charge the drone when a remaining battery amount of the drone is equal to or less than a predetermined level.

Further, the monitoring unit may include an OCR module that recognizes a text or a pattern of the outdoor billboard from the optical image to identify the alignment and completion of the text or the pattern, and propagate the warning information when a defect of the text or the pattern is identified by the OCR module.

According to the present invention, there is an effect in that while moving in the inspection vehicle, the drone is used to conduct safety inspections of outdoor billboards that are difficult to access or identify with naked eyes, the inspection vehicle may charge the drone wirelessly, and the maintenance tool provided in the inspection vehicle may be used to rapidly perform maintenance with one stop according to a safety inspection result.

BRIEF DESCRIPTION OF THE DRAWINGS

FIG. 1 illustrates a configuration diagram of a system for executing safety inspection and maintenance of an outdoor billboard by using a drone according to an exemplary embodiment of the present invention.

FIG. 2 illustrates an implementation diagram of the system for executing safety inspection and maintenance of an outdoor billboard by using a drone in FIG. 1.

FIG. 3 illustrates whether a connection bracket is defective.

FIG. 4 illustrates a hovering flight of the drone of FIG. 1.

DETAILED DESCRIPTION OF THE EMBODIMENTS

Hereinafter, an exemplary embodiment of the present invention having the above-described features will be described in more detail with reference to the accompanying drawings.

According to an exemplary embodiment of the present invention, a system for executing safety inspection and maintenance of an outdoor billboard by using a drone includes a drone 110 including an optical camera 111 and an infrared camera 112, and flying over a sky around a building in which the outdoor billboard is installed, and taking images of the outdoor billboard and a connection bracket 20 with the building; a monitoring unit 120 monitoring an image taken by the drone 110, and analyzing the image to identifying deformation of an exterior 10 of the outdoor billboard and whether the connection bracket 20 is defective; a flight control unit 130 controlling a flight of the drone 110; and an inspection vehicle 140 driving through an inspection area of the outdoor billboard, and having a docking station 141 for landing and charging the drone 110 on a roof, and safety inspection of an outdoor billboard is sequentially performed by using a drone while moving in an inspection vehicle, and maintenance is performed with one stop according to a safety inspection result by using a maintenance tool provided in the inspection vehicle.

Hereinafter, with reference to drawings, the above-described system executing safety inspection and maintenance of an outdoor billboard by using a drone will be described in detail as follows.

First of all, the drone 110 is equipped with an optical camera 111, an infrared camera 112, a GPS, a gyroscope, and an altitude measurement sensor to face the front and sides of the outdoor billboard, and take images of a front surface and a side surface of an outdoor billboard installed on a second floor or more, and a connection bracket 20 with the building, and transmit the taken image to the monitoring unit 120 while flying over the sky around the building where the outdoor billboards are installed on the outer wall.

Next, the monitoring unit 120 monitors optical image and thermal images taken by the drone 110 in real time, performs the image analysis of the optical image and the thermal image to identify deformation of an exterior 10 of the outdoor billboard and whether the connection bracket 20 propagate warning is defective to information for maintenance when identifying the defect.

Here, the monitoring unit 120 includes a first safety inspection algorithm 121 based on artificial intelligence which is previously learned by using optical images of the outdoor billboard and the connection bracket 20, which are previously collected and stored as big data, deformation such as damage, breakage, detachment, crack, tilt, frame bending, etc., and whether the connection bracket 2 connecting the outdoor billboard, and an exterior wall frame of the building is defective as a learning dataset, and analyzes the optical image transmitted from the optical camera 111 of the drone 110 through h the first safety inspection algorithm 121 to predict the deformation of the exterior 10, and whether the connection bracket 20 has the defect such as the damage, the breakage, bending, etc., and propagate warning information jointly with location information when identifying the defect.

Further, referring to FIG. 3, the first safety inspection algorithm 121 predicts whether the connection bracket 20 has the defect by identifying whether the number of bolts 21 fastened to the connection bracket 20 from the optical image matches the number of long bolt holes 22 of the connection bracket 20 from the optical image to propagate the warning information to fasten the bolts 21 according to the number of bolt holes 22.

Here, the first safety inspection algorithm 121 analyzes an optical image taken for a predetermined time by the optical camera 111, and identifies a shaking degree of the bolt 21 fastened to the connection bracket 20 or a shaking degree of the connection bracket 20 or a shaking degree of the outdoor billboard, and propagates the warning information when shaking enough to cause falling of the outdoor billboard is predicted to make a rapid response or perform a precise diagnosis.

Further, the first safety inspection algorithm 121 analyzes the optical images of the outdoor billboard and the connection bracket 20 to identify a birdhouse or foreign substances attached to the outdoor billboard and the connection bracket 20, and the drone 110 includes a predetermined capacity of high-pressure air storage tank and a high-pressure air injection pipe to inject high-pressure air toward the birdhouse or the foreign substances, and remove the birdhouse or the foreign substances by the control of the flight control unit 130.

Further, the drone 110 may blow and remove dust, foreign substances, etc., attached to a front plate of the outdoor billboard that is not easy for a worker to access, through the high-pressure air injection pipe.

Alternatively, the monitoring unit 120 includes a second safety inspection algorithm 122 based on the artificial intelligence which is previously learned by using, as a learning dataset, a thermal image of the outdoor billboard which is previously collected and stored as big data, and whether a power supply unit driving a lighting of the outdoor billboard is defective, and predicts whether the power supply unit is defective by analyzing the thermal image transmitted from the drone 110 through the second safety inspection algorithm 122 to determine that the power supply unit is defective and propagate the warning information when a temperature which exceeds a heating temperature according to normal driving is predicted.

Further, the monitoring unit 120 includes an OCR module 123 for identifying the alignment and completion of the text or pattern by recognizing the text or pattern of the outdoor billboard from the optical image transmitted from the drone 110 to identify the alignment and completion of the text or pattern, and may propagate the warning information when the defect in the text or pattern by damage, breakage, detachment, etc. by the OCR module 123 is identified.

In addition, the monitoring unit 120 includes a modeling module 124 for 3D-modeling the structure and shape of the outdoor billboard from the optical image and thermal image transmitted from the drone 110, and analyzes whether an outdoor billboard model by the modeling module 124 meets a criterion for installing the outdoor billboard to identify whether an illegal attachment, illegal hypothesis, or a light of a predefined illumination or more is used.

Next, the flight control unit 130 controls the flight of the drone 110 to take an image while facing the front and the side of the outdoor billboard.

Meanwhile, as illustrated in FIG. 4, when the outdoor billboard is installed on the rooftop or installed on a strut installed on the ground, the flight control unit 130 allows the drone 110 to perform a hovering flight over the outdoor billboard to take the image of the outdoor billboard omnidirectionally so that the monitoring unit 120 may identify the degree of tilt or shaking of the outdoor billboard to propagate the warning information when the overturn or fall is expected.

In addition, the drone 110 has a LIDAR sensor 113, and the flight control unit 130 may also control the flight to prevent a collision by detecting a surrounding obstacle through the LIDAR sensor 113 when accessing the outdoor billboard, when accessing another adjacent outdoor billboard from an outdoor billboard of which inspection is completed, or when taking the image of the corresponding outdoor billboard.

Next, the inspection vehicle 140 is equipped with the monitoring unit 120 and the flight control unit 130, drives through an inspection area of the outdoor billboard, stops, and makes a sequential flight on multiple outdoor billboards centering on the inspection vehicle 140 by the drone 110 in a flight controllable range, and has a docking station 141 for landing and charging of the drone 110 on a roof.

Through this, the flight control unit 130 stops inspection when a remaining battery amount of the drone 110 is equal to or less than a predetermined level during the flight for inspecting the outdoor billboard, sets a flight path to the docking station 141 with wireless charging and makes the drone 110 land on the docking station 141, and then charges the drone 110, and when the charging is completed, allows the drone 110 to deviate from the docking station 141 and subsequently perform the stopped inspection, thereby continuously inspecting multiple outdoor billboards. Further, the flight control unit 130 makes the drone 110 to land on the roof, thereby enabling rapid wireless charging by the docking station 141.

Further, the remote server 150 is connected to the monitoring unit 120 through a wireless communication network and formed at a remote area, and receives the image, the optical image and the thermal image transmitted from the monitoring unit 120, and the warning information. The remote server 150 precisely analyzes the images and the warning information to classify a risk level such as falling of the outdoor billboard, and transmits the warning information to a smart terminal 160 of a management subject of the corresponding outdoor billboard to rapidly respond when the risk level is high.

Accordingly, as described above, by the configuration of the system for executing safety inspection and maintenance of the outdoor billboard by using the drone, while moving from the inspection vehicle, the drone is used to gradually conduct safety inspections of outdoor billboards that are difficult to access or identify with naked eyes, and to charge the drone wirelessly through the inspection vehicle, and use the maintenance tool provided in the inspection vehicle to rapidly perform maintenance with one stop according to a safety inspection result.

Therefore, configurations illustrated in the exemplary embodiments and the drawings described in the present invention are only the most preferred exemplary embodiment of the present invention and do not represent all of the technical spirit of the present invention, and thus it is to be understood that various equivalents and modified examples, which may replace the configurations, are possible when filing the present application.

What is claimed is:

1. A system for executing safety inspection and maintenance of an outdoor billboard by using a drone, the system comprising: a drone including an optical camera and an infrared camera, and flying over a sky around a building in which the outdoor billboard is installed, and taking images of the outdoor billboard and a connection bracket with the building; a monitoring unit monitoring an image taken by the drone, and analyzing the image to identify deformation of an exterior of the outdoor billboard and whether the connection bracket is defective; a flight control unit controlling a flight of the drone; and an inspection vehicle driving through an inspection area of the outdoor billboard, and having a docking station for landing and charging the drone on a roof, wherein the monitoring unit includes a first safety inspection algorithm based on artificial intelligence which is previously learned by using, as a learning dataset, optical images of the outdoor billboard and the connection bracket which are previously collected and stored, and the deformation of the exterior and whether the connection bracket is defective, and analyzes the optical image transmitted from the optical camera of the drone through the first safety inspection algorithm to predict the deformation of the exterior and whether the connection bracket is defective, the first safety inspection algorithm identifies whether the number of bolts fastened to the connection bracket from the optical image matches the number of bolt holes of the connection bracket from the optical image to predict whether the connection bracket is defective, the first safety inspection algorithm analyzes an optical image taken by the optical camera for a predetermined time to identify a shaking degree of the bolt fastened to the connection bracket, a shaking degree of the connection bracket, or a shaking degree of the outdoor billboard, the monitoring unit includes a modeling module which 3-Dimensional (3D)-models a structure and a shape of the outdoor billboard from the optical image and a thermal image transmitted from the drone to analyze whether an outdoor billboard model by the modeling module meets a criterion for installing the outdoor billboard, and the flight control unit makes the drone perform a hovering flight over the outdoor billboard, and takes the image of the outdoor billboard omnidirectionally to allow the monitoring unit to identify a tilt degree or a shaking degree of the outdoor billboard.

2. The system of claim 1, wherein the first safety inspection algorithm analyzes the optical images of the outdoor billboard and the connection bracket to identify a birdhouse or foreign substances attached to the outdoor billboard and the connection bracket.

3. The system of claim 1, wherein the monitoring unit includes a second safety inspection algorithm based on the artificial intelligence which is previously learned by using, as a learning dataset, a thermal image of the outdoor billboard which is previously collected and stored, and whether a power supply unit driving a lighting of the outdoor billboard is defective, and predicts whether the power supply unit is defective by analyzing the thermal image transmitted from the drone through the second safety inspection algorithm.

4. The system of claim 1, wherein the flight control unit sets a flight path to the docking station, and lands the drone on the locking station, and charges the drone when a remaining battery amount of the drone is equal to or less than a predetermined level.

5. The system of claim 1, wherein the monitoring unit includes an Optical Character Recognition (OCR) module that recognizes a text or a pattern of the outdoor billboard from the optical image to identify alignment and completion of the text or the pattern, and propagates the warning information when a defect of the text or the pattern is identified by the OCR module.

* * * * *